United States Patent
Ruhland et al.

(10) Patent No.: US 12,412,774 B2
(45) Date of Patent: Sep. 9, 2025

(54) TAB ARRANGEMENT FOR RETAINING SUPPORT ELEMENTS OF SUBSTRATE SUPPORT

(71) Applicant: Applied Materials, Inc., Santa Clara, CA (US)

(72) Inventors: Fred Eric Ruhland, Pleasanton, CA (US); Pavankumar Ramanand Harapanhalli, Bangalore (IN); Gaurav Shrivastava, Bengaluru (IN); Yao-Hung Yang, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 523 days.

(21) Appl. No.: 17/839,235

(22) Filed: Jun. 13, 2022

(65) Prior Publication Data

US 2023/0402311 A1     Dec. 14, 2023

(51) Int. Cl.
*H01L 21/687*     (2006.01)
*C23C 16/458*     (2006.01)
*C23C 16/46*     (2006.01)

(52) U.S. Cl.
CPC ...... *H01L 21/6875* (2013.01); *C23C 16/4586* (2013.01); *C23C 16/46* (2013.01)

(58) Field of Classification Search
USPC ..................................... 118/728, 730, 500
See application file for complete search history.

(56) References Cited

U.S. PATENT DOCUMENTS

| | | |
|---|---|---|
| 2007/0246839 A1 | 10/2007 | Herchen et al. |
| 2011/0318142 A1 | 12/2011 | Gage et al. |
| 2013/0014896 A1 | 1/2013 | Shoji et al. |
| 2014/0008349 A1 | 1/2014 | Tzu et al. |
| 2014/0217665 A1 | 8/2014 | Cuvalci et al. |
| 2019/0027392 A1 | 1/2019 | Yang et al. |
| 2019/0080951 A1 | 3/2019 | Huston et al. |

OTHER PUBLICATIONS

International Seach Report and Written Opinion for PCT/US2023/024876 dated Oct. 4, 2023.

*Primary Examiner* — Yewebdar T Tadesse
(74) *Attorney, Agent, or Firm* — Moser Taboada

(57) ABSTRACT

Embodiments of substrate supports are provided herein. In some embodiments, a substrate support includes: a first plate having a plurality of openings extending into the first plate from an upper surface of the first plate to a bottom surface of each respective opening of the plurality of openings; a plurality of tabs comprising three or more tabs disposed in each respective opening and extending towards the upper surface of the first plate; and a plurality of support elements disposed in each of the plurality of openings, wherein the plurality of tabs are disposed around each of the plurality of support elements and configured to retain the plurality of support elements in the plurality of openings.

20 Claims, 6 Drawing Sheets

TAB ARRANGEMENT FOR RETAINING SUPPORT ELEMENTS OF SUBSTRATE SUPPORT

FIELD

Embodiments of the present disclosure generally relate to a substrate processing equipment.

BACKGROUND

Substrate processing systems typically include process chambers for performing a desired process, such as a degas process, on one or more substrates disposed therein. Typically, semiconductor substrates are degassed in a dedicated degas process module prior to a subsequent process step such as deposition as part of a standard process flow to outgas unwanted materials and contaminant prior to further processing. A degas chamber may include a heated substrate support. The heated substrate support may provide one or more of a controlled sealing gap, reduced metal contamination, and reduced thermal conduction to the substrate. To achieve such features, the heated substrate support may include a heater plate having support elements disposed in the heater plate for elevating the substrate and supporting the substrate with minimal contact with a remainder of the heated substrate support.

The support elements may be disposed in a pocket or opening in the heated substrate support. However, conventional means for retaining the support elements in the pocket or opening may put too much pressure or force on the support elements when swaged, leading to cracking or breaking of the support elements.

Accordingly, the inventors have provided embodiments of improved substrate supports.

SUMMARY

Embodiments of substrate supports are provided herein. In some embodiments, a substrate support includes: a first plate having a plurality of openings extending into the first plate from an upper surface of the first plate to a bottom surface of each respective opening of the plurality of openings; a plurality of tabs comprising three or more tabs disposed in each respective opening and extending towards the upper surface of the first plate; and a plurality of support elements disposed in each of the plurality of openings, wherein the plurality of tabs are disposed around each of the plurality of support elements and configured to retain the plurality of support elements in the plurality of openings.

In some embodiments, a substrate support includes: a first plate comprising: a plurality of openings extending into the first plate from an upper surface of the first plate to a bottom surface of each respective opening of the plurality of openings; a plurality of tabs comprising three or more tabs disposed in each respective opening and extending towards the upper surface of the first plate; and a plurality of support elements disposed in each of the plurality of openings, wherein the plurality of tabs are disposed around each of the plurality of support elements and configured to retain the plurality of support elements in the plurality of openings; a second plate coupled to a lower surface of the first plate, the second plate having one or more heater elements; and a support shaft coupled to the first plate and the second plate.

In some embodiments, a degas chamber includes: a chamber body defining an interior volume therein; a substrate support for supporting a substrate disposed in the interior volume, the substrate support comprising: a pedestal having a first plate having a plurality of openings extending into the first plate from an upper surface of the first plate to a bottom surface of each respective opening of the plurality of openings, a plurality of tabs comprising three or more tabs disposed in each respective opening and extending towards the upper surface of the first plate, and a plurality of support elements disposed in each of the plurality of openings, wherein the plurality of tabs are disposed around each of the plurality of support elements and configured to retain the plurality of support elements in the plurality of openings; and a support shaft coupled to the pedestal; and a heating lamp disposed in the interior volume opposite the substrate support.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
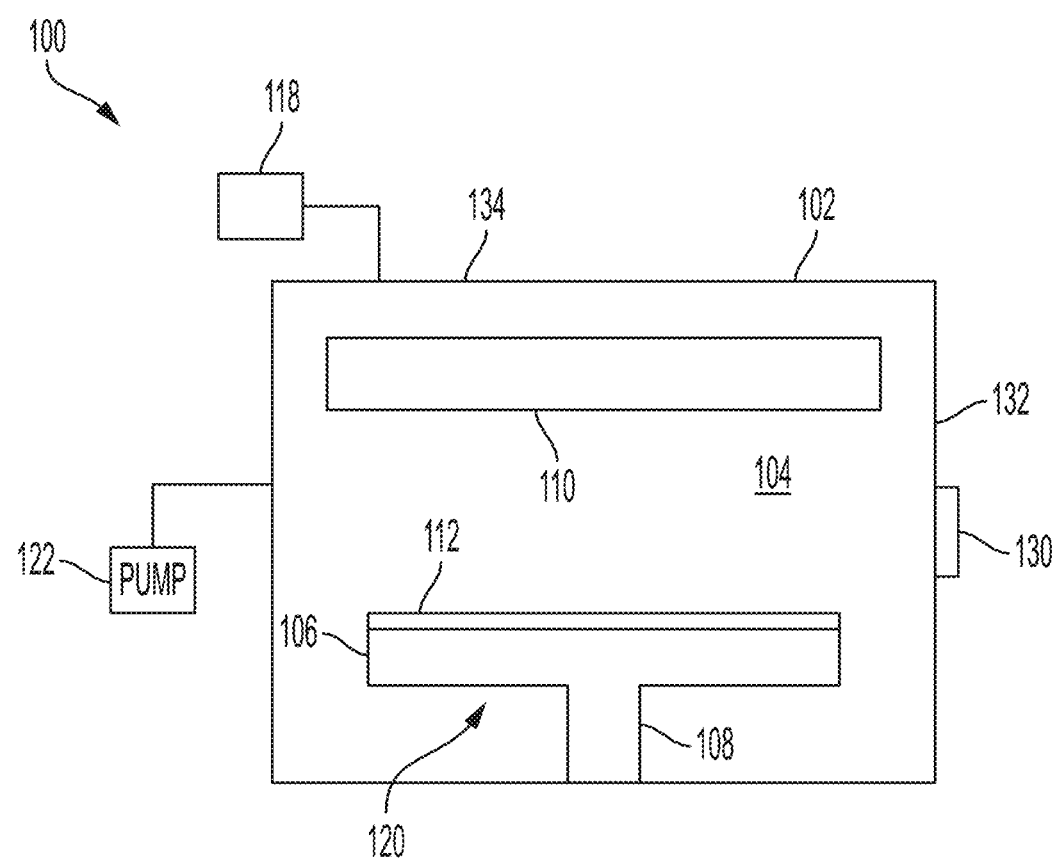
FIG. 1 depicts a schematic side view of a degas chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of substrate supports for use in semiconductor process chambers, for example, degas chambers, are provided herein. The substrate supports generally include a plurality of support elements for raising a substrate above an upper surface of the substrate support. The inventors have observed that the plurality of support elements may be prone to cracking or breaking due to forces exerted thereon when fixing or retaining the plurality of support elements to an upper plate of the substrate support. The upper plate, or first plate, provided herein include a plurality of tabs disposed about the plurality of support element such that when swaged to retain the plurality of support elements, the plurality of tabs advantageously exert reduced or no pressure on the plurality of support elements. In some embodiments, the plurality of tabs may comprise more than two tabs so that less force is needed to swage the plurality tabs, thereby exerting less pressure on the plurality of support elements. The bending plane or geometry of the plurality of tabs may also be suitably selected to advantageously exert reduced or no pressure on the plurality of support elements.

FIG. 1 depicts a schematic side view of a degas chamber, or chamber 100, in accordance with at least some embodiments of the present disclosure. The chamber 100 includes a chamber body 102 having sidewalls 132 and a lid 134 that enclose an interior volume 104 of the chamber 100. The chamber body 102 may be made of a suitable material, such as aluminum or the like. A substrate support 120 is disposed in the interior volume 104 and configured to support a substrate 112 thereon. The substrate support 120 may include a pedestal 106 coupled to a support shaft 108. The support shaft 108 may be hollow to accommodate conduits therethrough (e.g., fluid lines, power lines, or the like) that extend to the pedestal 106. The pedestal 106 can include a heater plate (discussed in more detail in FIG. 2 below).

A heating lamp 110 may be disposed in the interior volume 104 opposite the substrate support 120 and configured to heat the interior volume 104 to perform a degas procedure. The heating lamp 110 may comprise any suitable heating components, for example, one or more heater lamps, heater coils, resistive heater elements, or the like.

In some embodiments, a gas supply 118 is coupled to the chamber body 102 and configured to supply one or more gases to the interior volume 104. For example, the gas supply 118 may supply an inert gas such as argon gas. The gas supply 118 may also supply one or more suitable process gases. In some embodiments, a pump 122 is coupled to the chamber body 102 and configured to exhaust the interior volume 104, including outgas materials and process gases. The pump 122 or a second pump (not shown) may regulate a pressure of the interior volume 104. A slit valve 130 may be coupled to the chamber body 102 and configured for transfer of the substrate 112 into and out of the interior volume 104.

Figure 2:
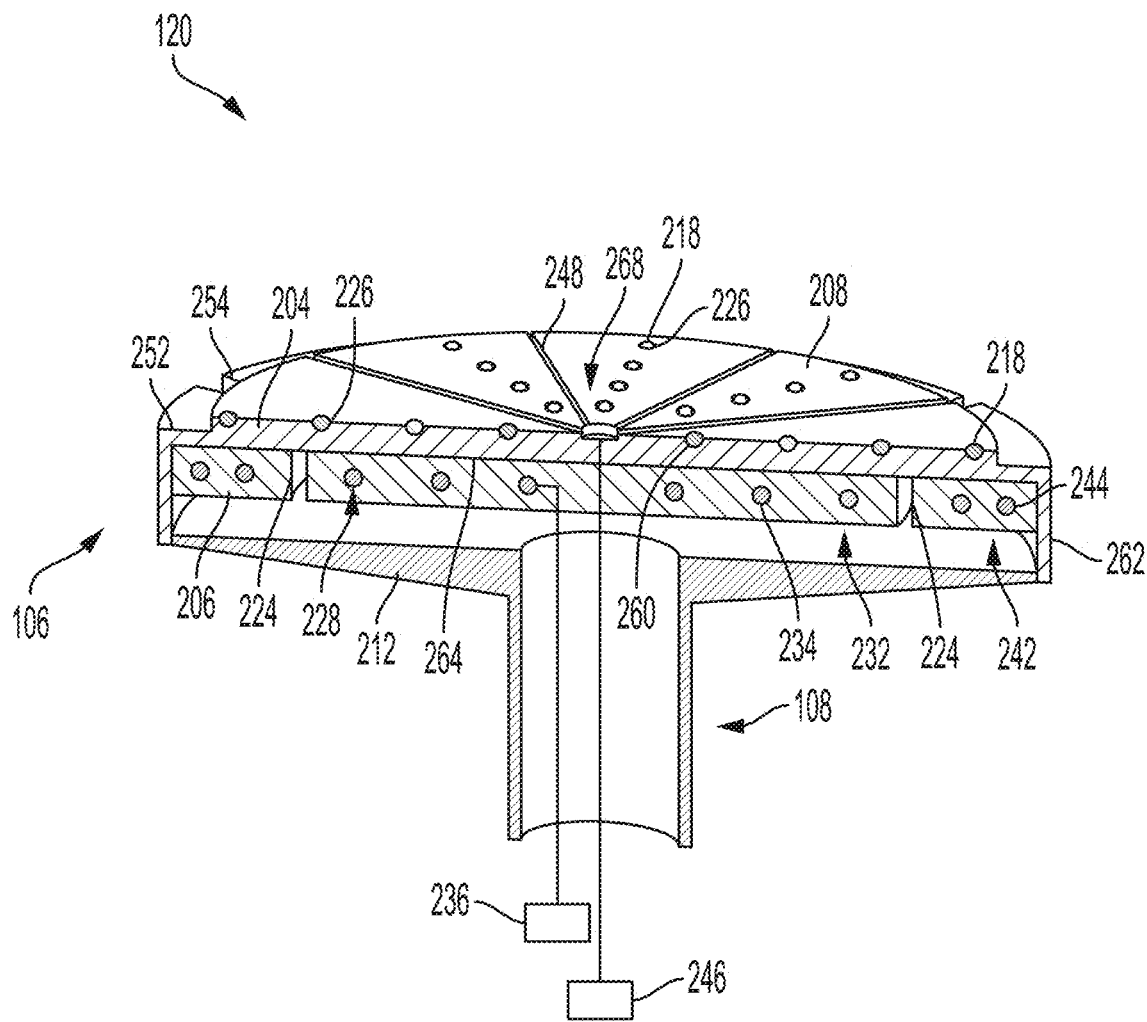
FIG. 2 depicts a schematic cross-sectional view of a substrate support in accordance with at least some embodiments of the present disclosure.

FIG. 2 depicts a schematic cross-sectional view of a substrate support 120 in accordance with at least some embodiments of the present disclosure. The substrate support 120 generally comprises a first plate 204 having a plurality of openings 226, or pockets, extending into the first plate 204 from an upper surface 208 of the first plate 204. A plurality of support elements 218 are disposed on a bottom surface 260 of the plurality of openings 226. The plurality of support elements 218 in each of the plurality of openings 226 are configured to raise the substrate 112 above the upper surface 208 and provide a low contact area between the substrate 112 and the pedestal 106. In some embodiments, the first plate 204 is formed from a process compatible metallic material, for example stainless steel. The first plate 204 may be at least as large as the substrate 112 to be supported thereon. Substrate diameters may be, for example 200, 300, or 450 mm (7.87, 11.81, or 17.72 inches), although larger and smaller diameter substrates may also benefit from the features of the present disclosure.

In some embodiments, a second plate 206 is coupled to a lower surface 264 of the first plate 204. The second plate 206 may generally include one or more heater elements 228. In some embodiments, the one or more heater elements 228 comprise one or more inner heater elements 234 disposed in an inner region 232 of the second plate 206 and one or more outer heater elements 244 disposed in an outer region 242 of the second plate 206. The one or more heater elements 228 may be any suitable heating elements such as, for example, resistive heating elements, lamps, or the like. The one or more heater elements 228 may be coupled to a heater power source 236 for providing power to the one or more heater elements 228. In some embodiments, the heater power source 236 may provide power to the one or more inner heater elements 234 and the one or more outer heater elements 244. In some embodiments, the heater power source 236 comprises a first power source for the one or more inner heater elements 234 and a second power source for the one or more outer heater elements 244.

In some embodiments, the second plate includes a thermal break 224 disposed between the one or more inner heater elements 234 and the one or more outer heater elements 244. In some embodiments, the thermal break 224 is a gap configured to reduce thermal crosstalk between the inner region 232 and the outer region 242. In some embodiments, the support shaft 108 is coupled to the first plate 204 and the second plate 206.

In some embodiments, the plurality of openings 226 are disposed at regular intervals along circles that are concentric with a center 268 of the first plate 204. In some embodiments, the plurality of support elements 218 may be disposed on the upper surface 208 along a random pattern. In some embodiments, the plurality of support elements 218 are ball-shaped or have other suitable shapes. In some embodiments, the plurality of support elements 218 are made of non-metal or sapphire balls. The plurality of support elements 218 may be complete spheres, have a spherical shape with a flattened bottom, or the like.

The low contact area facilitated by the plurality of support elements 218 may also help reduce or prevent contamination and allows for elevating the substrate 112 to degas a backside of the substrate 112 without having to flip the substrate 112 over. The low contact area between the upper surface 208 and the substrate 112 also reduces or prevents substrate scratching or sticking. The plurality of support elements 218 may stick out very slightly from the upper surface 208 so that there is adequate thermal coupling between the substrate 112 and the first plate 204. For example, the plurality of support elements 218 may be raised about 0.005 inches to about 0.02 inches from the upper surface 208 of the first plate 204.

In some embodiments, the first plate 204 may include gas grooves 248 on the upper surface 208 for dispersing a backside gas. The gas grooves 248 may be arranged in any suitable shape. The gas grooves 248 may be coupled to a backside gas source 246. In some embodiments, the backside gas source 246 may deliver backside gas at a first location proximate the center 268 of the first plate 204, and the gas grooves 248 may extend radially outward from the first location. The backside gas source 246 may extend to the pedestal 106 through the support shaft 108.

In some embodiments, the first plate 204 includes an outer peripheral notch 252. The outer peripheral notch may be configured to support a chamber component, for example, a process kit component such as an edge or focus ring. In some embodiments, an outer lip 262 extends downward from an outer edge of the first plate 204. In some embodiments, the outer lip 262 surrounds the second plate 206. In some embodiments, the pedestal 106 includes a base plate 212 coupled to the first plate 204, for example, to the outer lip 262 of the first plate 204. The base plate 212 may be directly coupled to the support shaft 108. In some embodiments, the first plate 204 includes one or more slots 254 in a peripheral region of the first plate 204. The one or more slots 254 may comprise alignment features or openings for lift pin assemblies.

Figure 3:
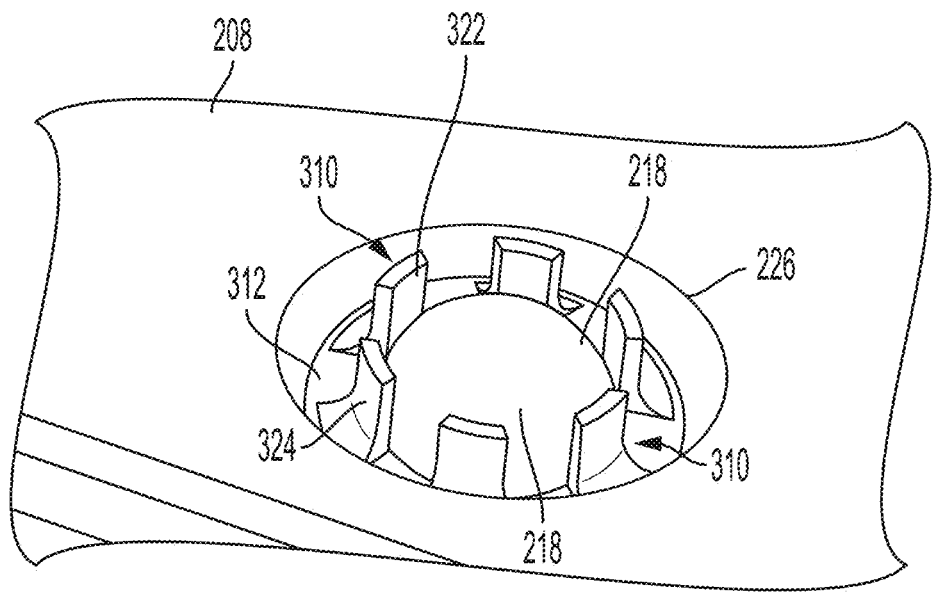
FIG. 3 depicts an isometric view of a plurality of tabs in accordance with at least some embodiments of the present disclosure.
Figure 4:
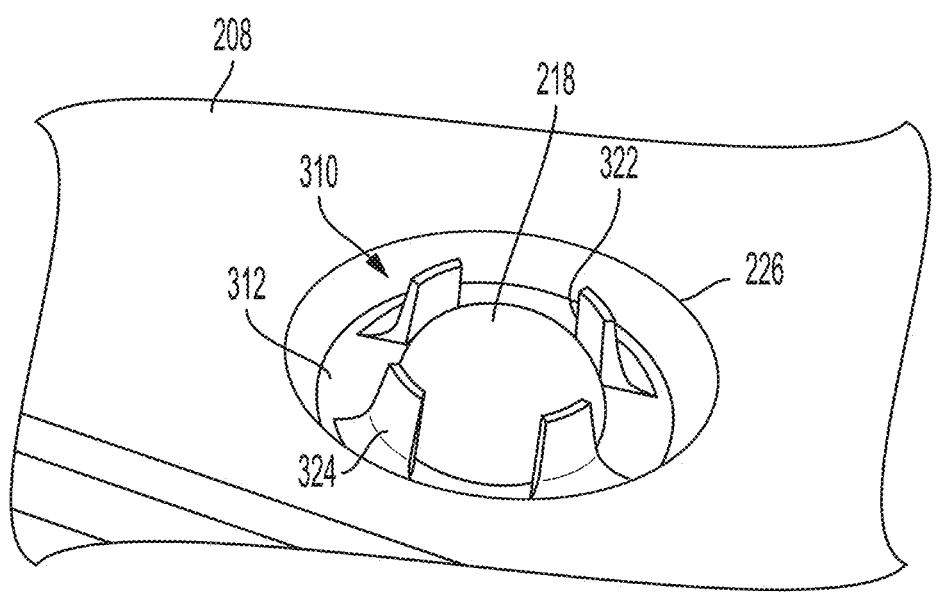
FIG. 4 depicts an isometric view of a plurality of tabs in accordance with at least some embodiments of the present disclosure.
Figure 6:
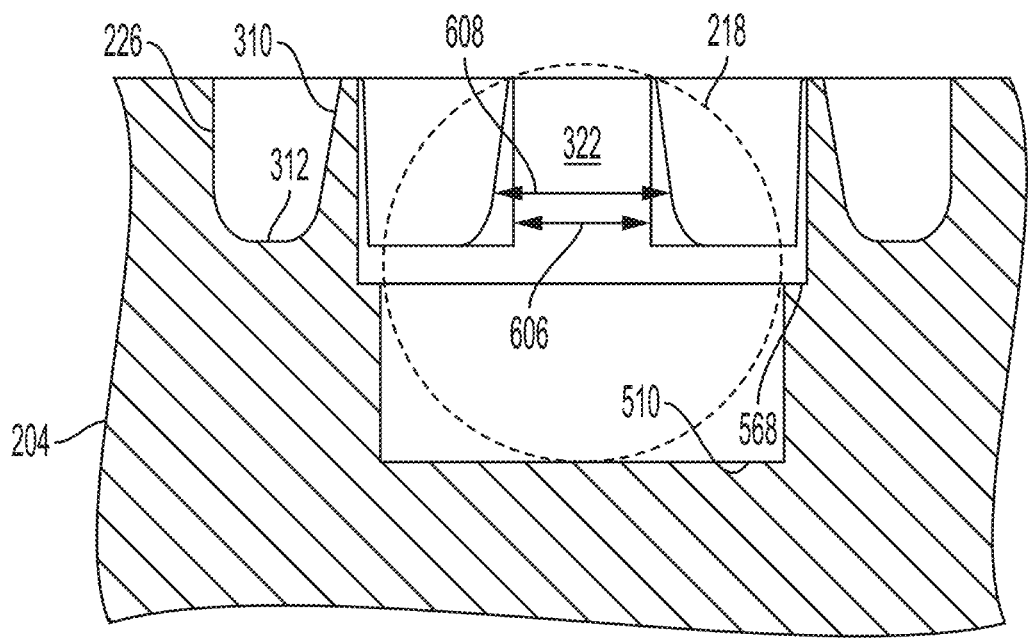
FIG. 6 depicts a schematic cross-sectional view of a portion of a first plate in accordance with at least some embodiments of the present disclosure.

FIG. 3 depicts an isometric view of a plurality of tabs 310 in accordance with at least some embodiments of the present disclosure. FIG. 4 depicts an isometric view of a plurality of tabs in accordance with at least some embodiments of the present disclosure. The plurality of tabs 310 comprise three or more tabs disposed in each respective opening of the plurality of openings 226 and extending from a first floor 312 of the plurality of openings 226 towards the upper surface 208 of the first plate 204. The three or more tabs advantageously require less force to swage the plurality of tabs as compared to less than three tabs for retaining the plurality of support elements 218. The plurality of tabs 310 are disposed around each of the plurality of support elements 218 and configured to retain the plurality of support elements 218 in the plurality of openings 226. In some embodiments, the plurality of tabs 310 include 4 or more tabs. In some embodiments, the plurality of tabs 310 consist of 4 tabs as depicted in FIG. 3 or 6 tabs as depicted in FIG. 4. The plurality of tabs 310 may be arranged at regular intervals about each of the plurality of support elements 218. In use, the plurality of tabs 310 are swaged to plastically deform inward toward each other to retain the support element disposed therein via any suitable swage tool. In some embodiments, the plurality of tabs 310 are made of a metal. In some embodiments, the plurality of tabs 310 are made of the same material as the first plate 204.

Each of the plurality of tabs 310 include an inner surface 322 facing one of the plurality of support elements 218 and an outer surface 324 opposite the inner surface 322. In some embodiments, a surface area of the inner surface 322 is less than a surface area of the outer surface 324. In some embodiments, the inner surface 322 is curved to conform with the geometry of the one or more support elements 218.

Figure 5A:
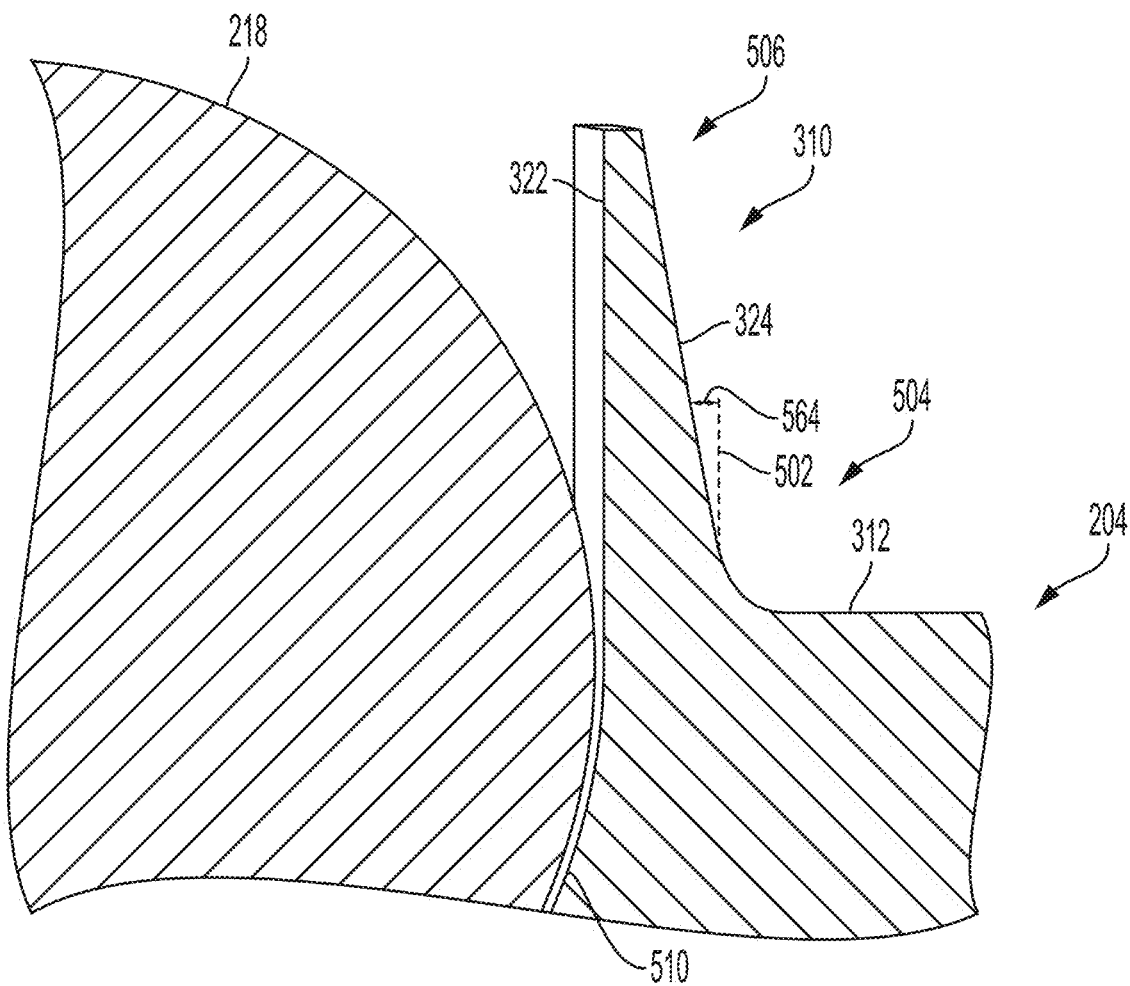
FIG. 5A depicts a cross-sectional side view of a tab in accordance with at least some embodiments of the present disclosure.

FIG. 5A depicts a cross-sectional side view of a tab of the plurality of tabs 310 in accordance with at least some embodiments of the present disclosure. In some embodiments, the bottom surface 260 of each respective opening includes the first floor 312 and a second floor 510 extending from the first floor 312 towards the lower surface 264 of the first plate 204. The second floor 510 is configured to accommodate the plurality of support elements 218 such that the plurality of support elements 218 may rest on the second floor 510. In some embodiments, the second floor 510 is rounded corresponding with a shape of the plurality of support elements 218.

The plurality of tabs 310 may extend upward from the first floor 312. In some embodiments, the outer surface 324 of each of the plurality of tabs 310 extends at an angle 564 with respect to an axis (e.g., axis 502) orthogonal to the upper surface 208 of the first plate 204. In some embodiments, the angle 564 is about 5 degrees to about 20 degrees. In such embodiments, a thickness of the plurality of tabs 310 decreases from a lower portion 504 of the plurality of tabs 310 to an upper portion 506 of the plurality of tabs 310 so that less force or pressure is required to swage the plurality of tabs 310.

Figure 5B:
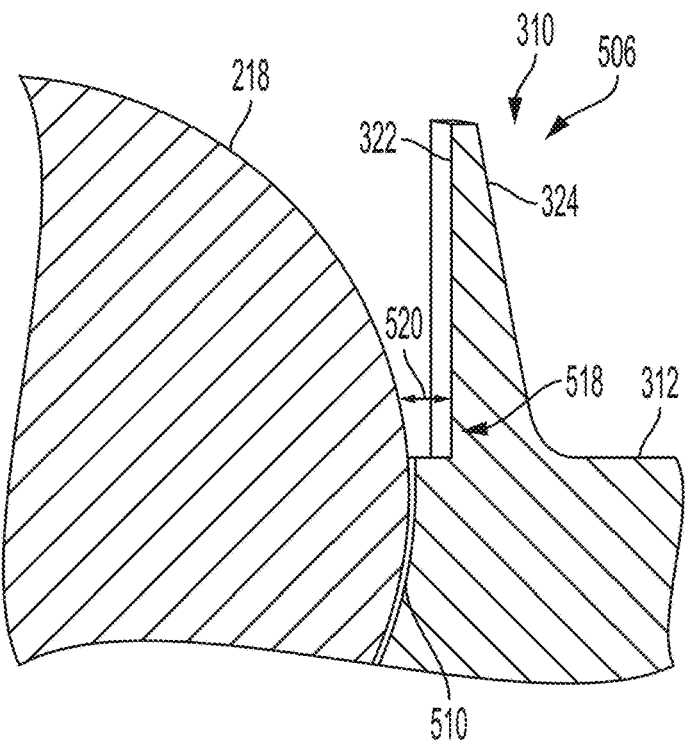
FIG. 5B depicts a cross-sectional side view of a tab in accordance with at least some embodiments of the present disclosure.

FIG. 5B depicts a cross-sectional side view of a tab of the plurality of tabs 310 in accordance with at least some embodiments of the present disclosure. The inner surface 322 of each of the plurality of tabs 310 is a support element facing surface. In some embodiments, a base 518 of the inner surface 322 is spaced from the support element 218 by a distance 520. In some embodiments, the distance 520 is about 0.1 to about 0.8 mm. The spacing between the tab and the support element prevents the base 518 from contacting the support element when the tab is swaged, removing any force or pressure on portions of the support element opposite the base 518. In such embodiments, when swaged, the plurality of tabs 310 may minimally contact the plurality of support elements 218 at locations corresponding with the upper portion 506 of the plurality of tabs 310. In some embodiments, when swaged, the plurality tabs 310 may be bent over but not in direct contact with the plurality of support elements 218, exerting no force or pressure on the plurality of support elements 218.

Figure 5C:
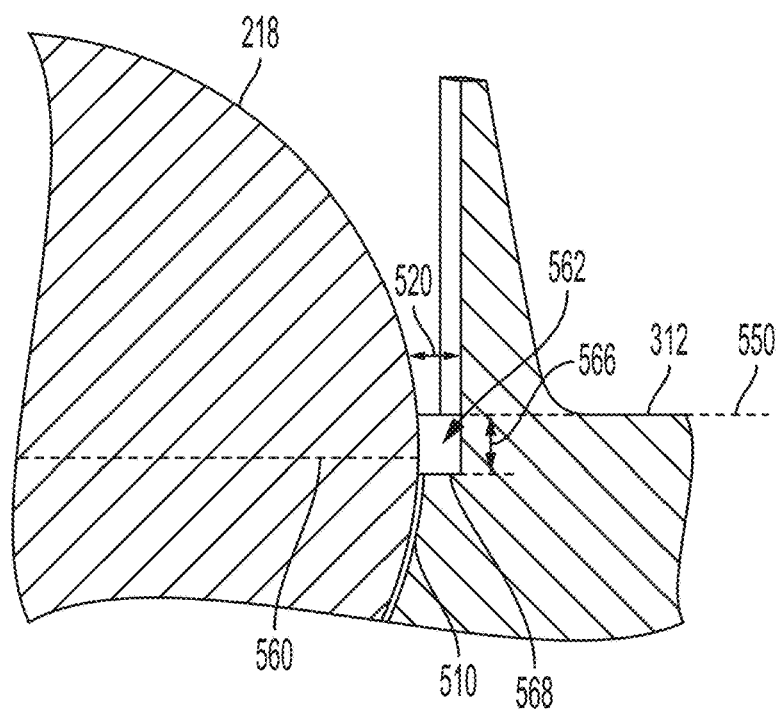
FIG. 5C depicts a cross-sectional side view of a tab in accordance with at least some embodiments of the present disclosure.

FIG. 5C depicts a cross-sectional side view of a tab of the plurality of tabs 310 in accordance with at least some embodiments of the present disclosure. In some embodiments, a plane of bending 550 of the plurality of tabs 310 is disposed above a horizontal center plane 560 of the plurality of support elements 218. The plane of bending 550 may corresponding with an interface between the first floor 312 and the lower portion 504 of the plurality of tabs 310. The plurality of support elements 218 may be more prone to cracking, chipping or breaking when stress or force is exerted along the horizontal center plane 560 of the plurality of support elements 218. In some embodiments, the plane of bending 550 is disposed vertically above the horizontal center plane 560 to reduce stress or force proximate the horizontal center plane 560 of the plurality of support elements 218. In some embodiments, the first floor 312 may include an annular recess 562 at an interface between the first floor 312 and the second floor 510. The annular recess 562 advantageously forms a space between the plurality of support elements 218 along the horizontal center plane 560 and the first plate 204 so that no stress or pressure is exerted on the plurality of support elements 218 proximate the horizontal center plane 560. In some embodiments, the annular recess 562 has a height 566 of about to about 0.8 mm from the first floor 312 to a lower surface 568 of the annular recess 562.

FIG. 6 depicts a schematic cross-sectional view of a portion of a first plate 204 in accordance with at least some embodiments of the present disclosure. In some embodiments, the inner surface 322 of the plurality of tabs 310 has a width 606 less than a width 608 of the outer surface 324. In some embodiments, the second floor 510 is substantially flat.

Figure 7:
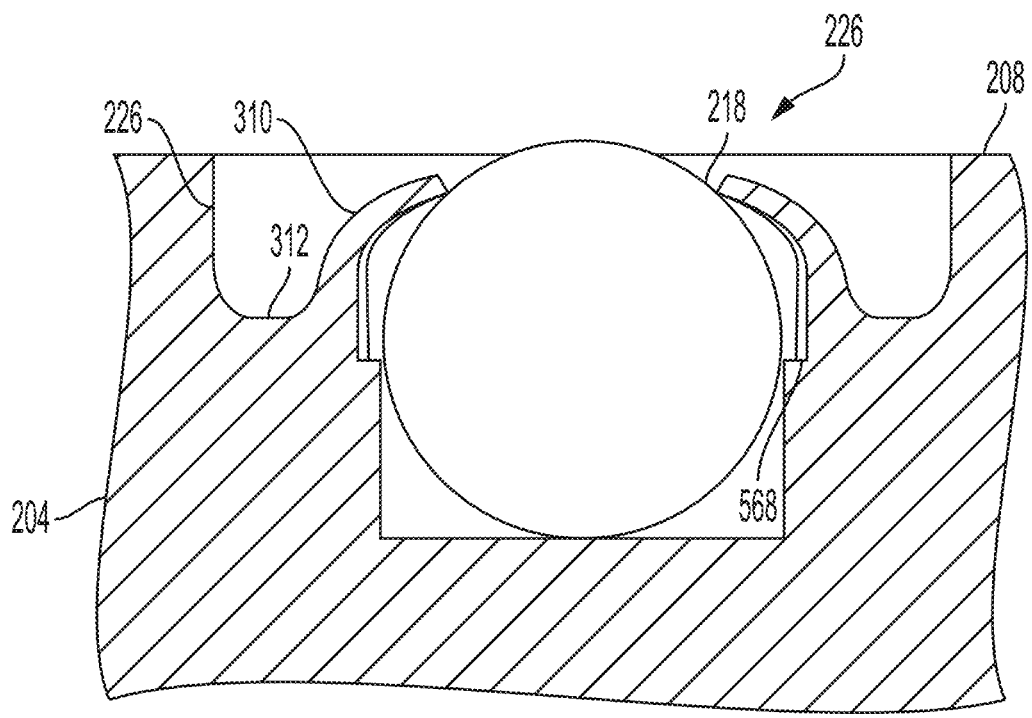
FIG. 7 depicts a schematic cross-sectional view of a portion of a first plate with a plurality of tabs in a bent position in accordance with at least some embodiments of the present disclosure.

FIG. 7 depicts a schematic cross-sectional view of a portion of a first plate 204 with a plurality of tabs 310 in a bent position in accordance with at least some embodiments of the present disclosure. As shown in FIG. 7, in some embodiments, the plurality of tabs 310, when bent, may minimally contact the plurality of support elements 218 at an upper portion of the plurality of support elements 218. In some embodiments, the plurality of tabs 310 may be bent over the plurality of support elements 218 without contacting the plurality of support elements 218.

While the foregoing is directed to embodiments of the present disclosure, other and further embodiments of the disclosure may be devised without departing from the basic scope thereof.

The invention claimed is:

1. A substrate support, comprising:
   a first plate having a plurality of openings extending into the first plate from an upper surface of the first plate to a bottom surface of each respective opening of the plurality of openings;
   a plurality of tabs comprising three or more tabs disposed in each respective opening and extending towards the upper surface of the first plate; and
   a plurality of support elements disposed in corresponding ones of the plurality of openings, wherein the plurality of tabs are disposed around each of the plurality of support elements and configured to retain the plurality of support elements in the plurality of openings.

2. The substrate support of claim 1, wherein the plurality of support elements are ball-shaped.

3. The substrate support of claim 1, wherein the plurality of tabs consist of 4 tabs or 6 tabs.

4. The substrate support of claim 1, wherein an inner surface of each of the plurality of tabs faces a respective support element of the plurality of support elements, and wherein a base of the inner surface is spaced from the respective support element.

5. The substrate support of claim 1, wherein a thickness of the plurality of tabs decrease from a lower portion of the plurality of tabs to an upper portion of the plurality of tabs.

6. The substrate support of claim 1, wherein an outer surface of each of the plurality of tabs extends at an angle of about 5 degrees to about 20 degrees with respect to an axis orthogonal to an upper surface of the first plate.

7. The substrate support of claim 1, wherein a bottom surface of each respective opening includes a first floor disposed below the plurality of tabs and a second floor extending from the first floor towards a lower surface of the first plate to accommodate the plurality of support elements.

8. The substrate support of claim 1, wherein the plurality of openings are disposed at regular intervals along circles that are concentric with a center of the first plate.

9. The substrate support of claim 1, wherein the plurality of tabs include a lower portion and an upper portion, wherein the lower portion is thicker than the upper portion.

10. A substrate support, comprising:
    a first plate comprising:
        a plurality of openings extending into the first plate from an upper surface of the first plate to a bottom surface of each respective opening of the plurality of openings;
        a plurality of tabs comprising three or more tabs disposed in each respective opening and extending towards the upper surface of the first plate; and
        a plurality of support elements disposed in corresponding ones of the plurality of openings, wherein the plurality of tabs are disposed around each of the plurality of support elements and configured to retain the plurality of support elements in the plurality of openings;
    a second plate coupled to a lower surface of the first plate, the second plate having one or more heater elements; and
    a support shaft coupled to the first plate and the second plate.

11. The substrate support of claim 10, wherein the one or more heater elements comprise one or more inner heater elements and one or more outer heater elements.

12. The substrate support of claim 11, wherein the second plate includes a thermal break between the one or more inner heater elements and one or more outer heater elements.

13. The substrate support of claim 10, wherein the plurality of tabs include 4 or more tabs.

14. The substrate support of claim 10, wherein a plane of bending of the plurality of tabs is disposed above a horizontal center plane of the plurality of support elements.

15. The substrate support of claim 10, wherein the plurality of support elements extend above the upper surface of the first plate.

16. The substrate support of claim 10, wherein an inner surface of the plurality of tabs has a width less a width of an outer surface of the plurality of tabs.

17. A degas chamber, comprising:
    a chamber body defining an interior volume therein;
    a substrate support for supporting a substrate disposed in the interior volume, the substrate support comprising:
        a pedestal having a first plate having a plurality of openings extending into the first plate from an upper surface of the first plate to a bottom surface of each respective opening of the plurality of openings, a plurality of tabs comprising three or more tabs disposed in each respective opening and extending towards the upper surface of the first plate, and a plurality of support elements disposed in corresponding ones of the plurality of openings, wherein the plurality of tabs are disposed around each of the plurality of support elements and configured to retain the plurality of support elements in the plurality of openings; and
        a support shaft coupled to the pedestal; and
    a heating lamp disposed in the interior volume opposite the substrate support.

18. The degas chamber of claim 17, wherein the pedestal includes a second plate coupled to the first plate, wherein the second plate includes one or more resistive heating elements disposed therein.

19. The degas chamber of claim 17, wherein a bending plane of the plurality of tabs is disposed above a horizontal center plane of the plurality of support elements.

20. The degas chamber of claim 17, further comprising a gas supply coupled to the chamber body to supply one or more process gases to the interior volume.

* * * * *